United States Patent
Su et al.

(10) Patent No.: US 12,092,661 B2
(45) Date of Patent: *Sep. 17, 2024

(54) CANTILEVER PROBE CARD DEVICE AND ELASTIC PROBE THEREOF

(71) Applicant: CHUNGHWA PRECISION TEST TECH. CO., LTD., Taoyuan (TW)

(72) Inventors: Wei-Jhih Su, Taichung (TW);
Chao-Hui Tseng, New Taipei (TW);
Hao-Yen Cheng, Taoyuan (TW);
Rong-Yang Lai, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 153 days.

This patent is subject to a terminal disclaimer.

(21) Appl. No.: 17/981,257

(22) Filed: Nov. 4, 2022

(65) Prior Publication Data
US 2023/0349952 A1     Nov. 2, 2023

(30) Foreign Application Priority Data

Apr. 29, 2022 (TW) ................................. 111116325

(51) Int. Cl.
*G01R 1/073*     (2006.01)
*G01R 1/067*     (2006.01)

(52) U.S. Cl.
CPC ..... *G01R 1/07342* (2013.01); *G01R 1/06727* (2013.01); *G01R 1/06738* (2013.01); *G01R 1/06794* (2013.01); *G01R 1/07357* (2013.01)

(58) Field of Classification Search
CPC ... G01R 1/00; G01R 1/02; G01R 1/06; G01R 1/067; G01R 1/06711; G01R 1/06716; G01R 1/06727; G01R 1/06733; G01R 1/06738; G01R 1/06794; G01R 1/073; G01R 1/07307; G01R 1/07342; G01R 1/07357

See application file for complete search history.

(56) References Cited

U.S. PATENT DOCUMENTS

| | | | |
|---|---|---|---|
| 11,879,912 B2* | 1/2024 | Su | G01R 1/07357 |
| 11,913,973 B2* | 2/2024 | Su | G01R 1/06794 |
| 2009/0009201 A1* | 1/2009 | Miyagi | G01R 1/06733 |
| | | | 324/750.16 |
| 2009/0160473 A1* | 6/2009 | Fukami | G01R 1/06727 |
| | | | 29/874 |

(Continued)

*Primary Examiner* — Hoai-An D. Nguyen
(74) *Attorney, Agent, or Firm* — Li & Cai Intellectual Property (USA) Office (57) ABSTRACT

A cantilever probe card device and an elastic probe thereof are provided. The elastic probe includes a soldering segment, a testing segment, two outer elastic arms spaced apart from each other. The testing segment is spaced apart from the soldering segment along an arrangement direction, and has a needle tip, an outer edge, and an inner edge that is opposite to the outer edge. Each of the two outer elastic arms has two end portions respectively connected to the soldering segment and the inner edge of the testing segment. Moreover, one of the two outer elastic arms adjacent to the needle tip is defined as a first outer elastic arm, and another one of the two outer elastic arms is defined as a second outer elastic arm. Specifically, a length of the first outer elastic arm is greater than a length of the second outer elastic arm.

10 Claims, 13 Drawing Sheets

(56) References Cited

U.S. PATENT DOCUMENTS

| | | | |
|---|---|---|---|
| 2015/0168483 A1* | 6/2015 | Kim ................... | G01R 1/0408 |
| | | | 324/754.08 |
| 2020/0341030 A1* | 10/2020 | Selvaraj ............. | G01R 1/07314 |
| 2021/0041482 A1* | 2/2021 | Kishi ................. | G01R 1/06727 |
| 2023/0266361 A1* | 8/2023 | An ..................... | G01R 1/06716 |
| | | | 324/755.01 |
| 2023/0349953 A1* | 11/2023 | Su ...................... | G01R 1/07342 |

* cited by examiner

CANTILEVER PROBE CARD DEVICE AND ELASTIC PROBE THEREOF

CROSS-REFERENCE TO RELATED PATENT APPLICATION

This application claims the benefit of priority to Taiwan Patent Application No. 111116325, filed on Apr. 29, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a cantilever probe card device and an elastic probe thereof.

BACKGROUND OF THE DISCLOSURE

A conventional cantilever probe card includes a seat and a plurality of cantilever probes that are fixed onto the seat, and each of the cantilever probes includes a body segment and a testing segment that is substantially and perpendicularly connected to the body segment. When any one of the cantilever probes abuts against a device under test (DUT) through a needle tip of the testing segment thereof, the needle tip will have a displacement relative to the DUT. Accordingly, reducing the displacement of the cantilever probe is one of directions for improvement in the related art.

SUMMARY OF THE DISCLOSURE

In response to the above-referenced technical inadequacies, the present disclosure provides a cantilever probe card device and an elastic probe thereof to effectively improve on the issues associated with conventional cantilever probe cards.

In one aspect, the present disclosure provides a cantilever probe card device, which includes a substrate and a plurality of elastic probes that are fixed to the substrate. Each of the elastic probes includes a soldering segment, a testing segment, and two outer elastic arms. The soldering segment has a first end and a second end that is opposite to the first end. The first end is soldered onto the substrate. The testing segment is spaced apart from the soldering segment along an arrangement direction. The testing segment has a needle tip, an outer edge, and an inner edge that is opposite to the outer edge. The two outer elastic arms are spaced apart from each other. Each of the two outer elastic arms has two end portions respectively connected to the second end of the soldering segment and the inner edge of the testing segment. One of the two outer elastic arms adjacent to the needle tip is defined as a first outer elastic arm, and another one of the two outer elastic arms is defined as a second outer elastic arm. A length of the first outer elastic arm is greater than a length of the second outer elastic arm. When the needle tip of each of the elastic probes abuts against a device under test (DUT), at least one of the two outer elastic arms is elastically deformable so as to allow a displacement of the needle tip along the arrangement direction to be less than 20 µm.

In another aspect, the present disclosure provides an elastic probe of a cantilever probe card device. The elastic probe includes a soldering segment, a testing segment, and two outer elastic arms. The soldering segment has a first end and a second end that is opposite to the first end. The first end is configured to be soldered onto a substrate. The testing segment is spaced apart from the soldering segment along an arrangement direction. The testing segment has a needle tip, an outer edge, and an inner edge that is opposite to the outer edge. The two outer elastic arms are spaced apart from each other. Each of the two outer elastic arms has two end portions respectively connected to the second end of the soldering segment and the inner edge of the testing segment. One of the two outer elastic arms adjacent to the needle tip is defined as a first outer elastic arm, and another one of the two outer elastic arms is defined as a second outer elastic arm. A length of the first outer elastic arm is greater than a length of the second outer elastic arm.

Therefore, the elastic probe of the cantilever probe card device provided by the present disclosure can be formed with the specific structure (e.g., the length of the first outer elastic arm being greater than that of the second outer elastic arm), such that when the needle tip abuts against the DUT, at least one of the two outer elastic arms is elastically deformable, thereby effectively absorbing a reaction force and allowing the displacement of the needle tip along the arrangement direction to be less than 20 µm.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
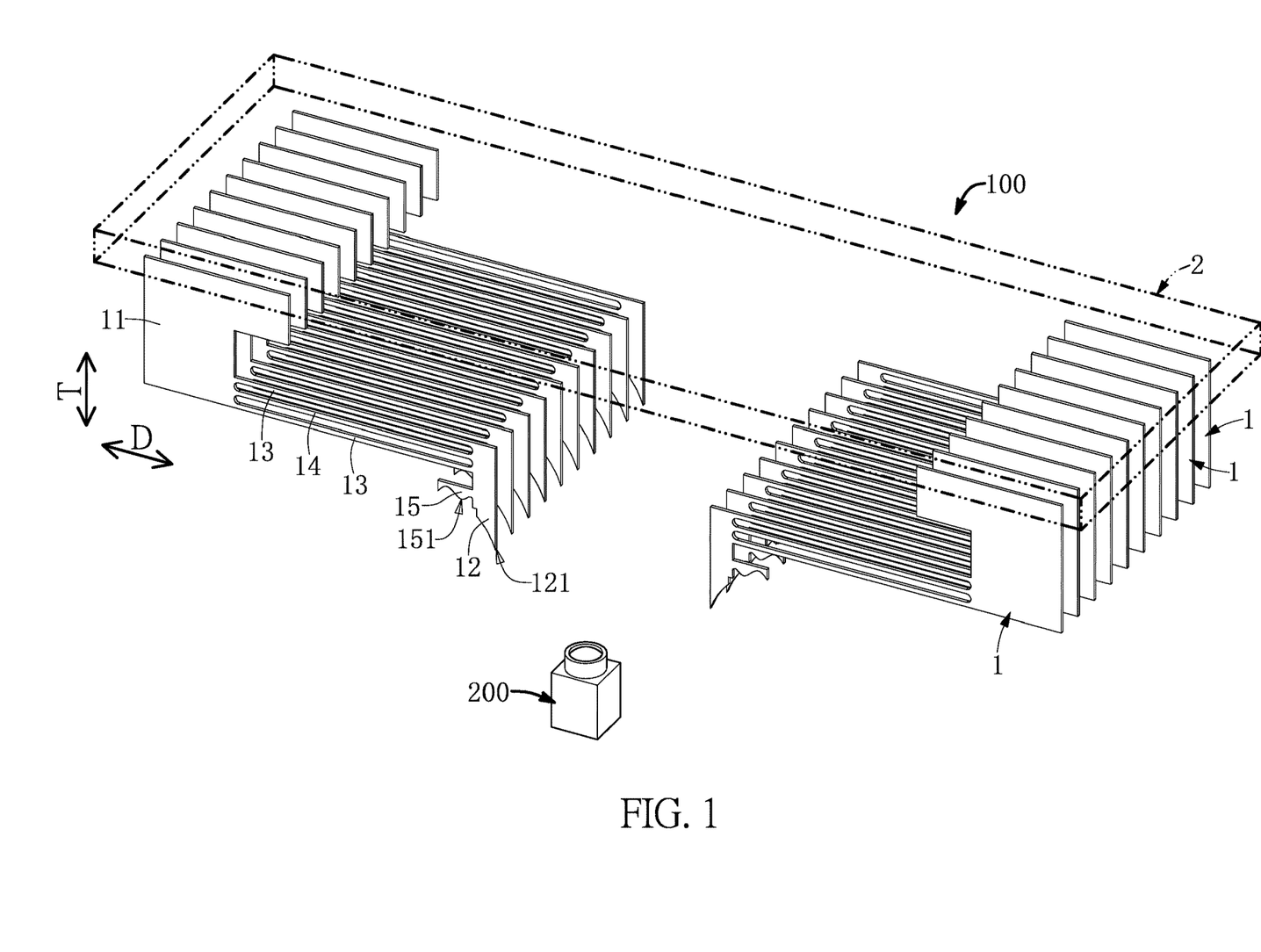
FIG. 1 is a perspective view of a cantilever probe card device according to a first embodiment of the present disclosure.
Figure 2:
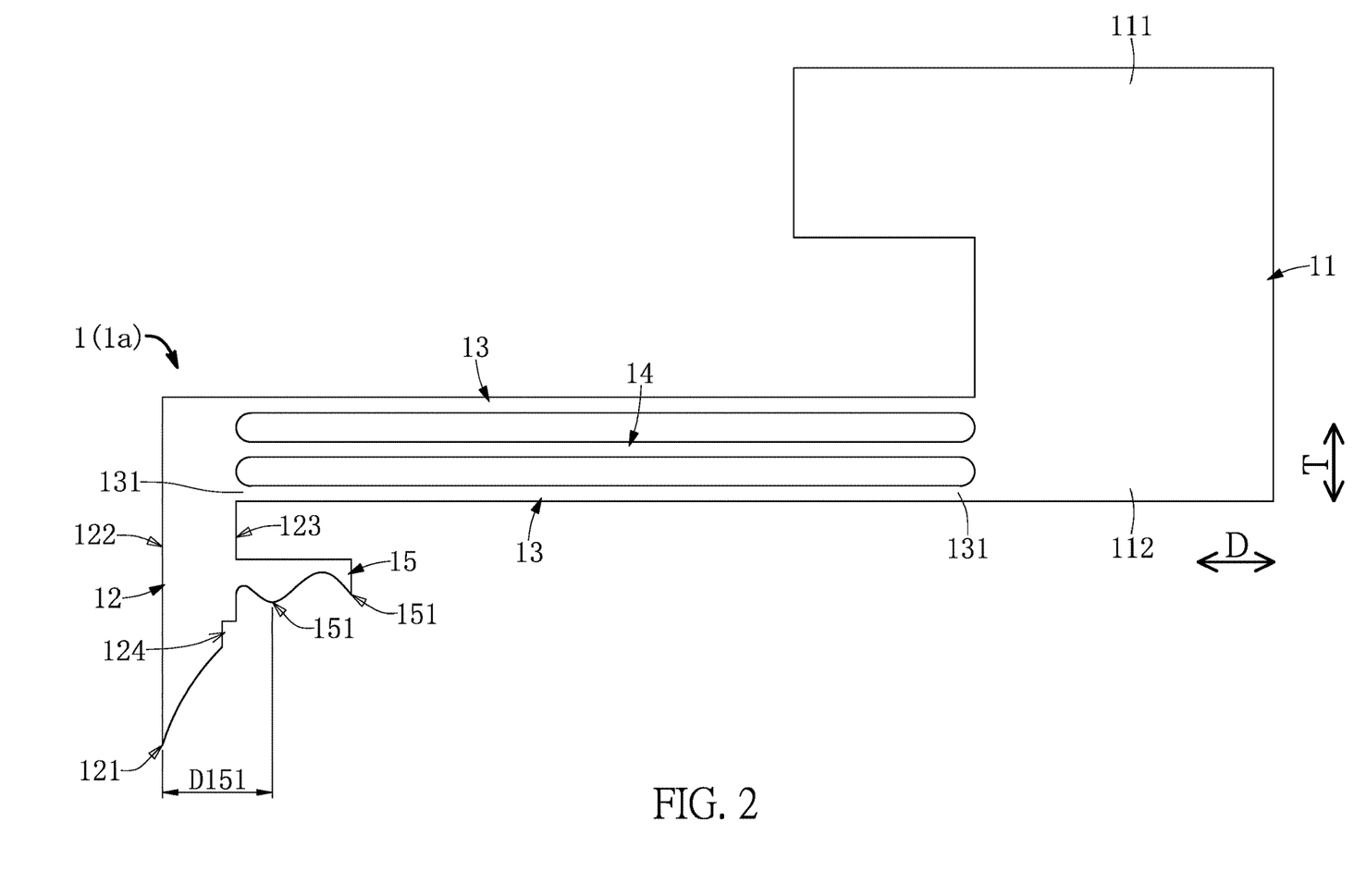
FIG. 2 is a planar view showing a cantilever probe of FIG. 1.
Figure 3:
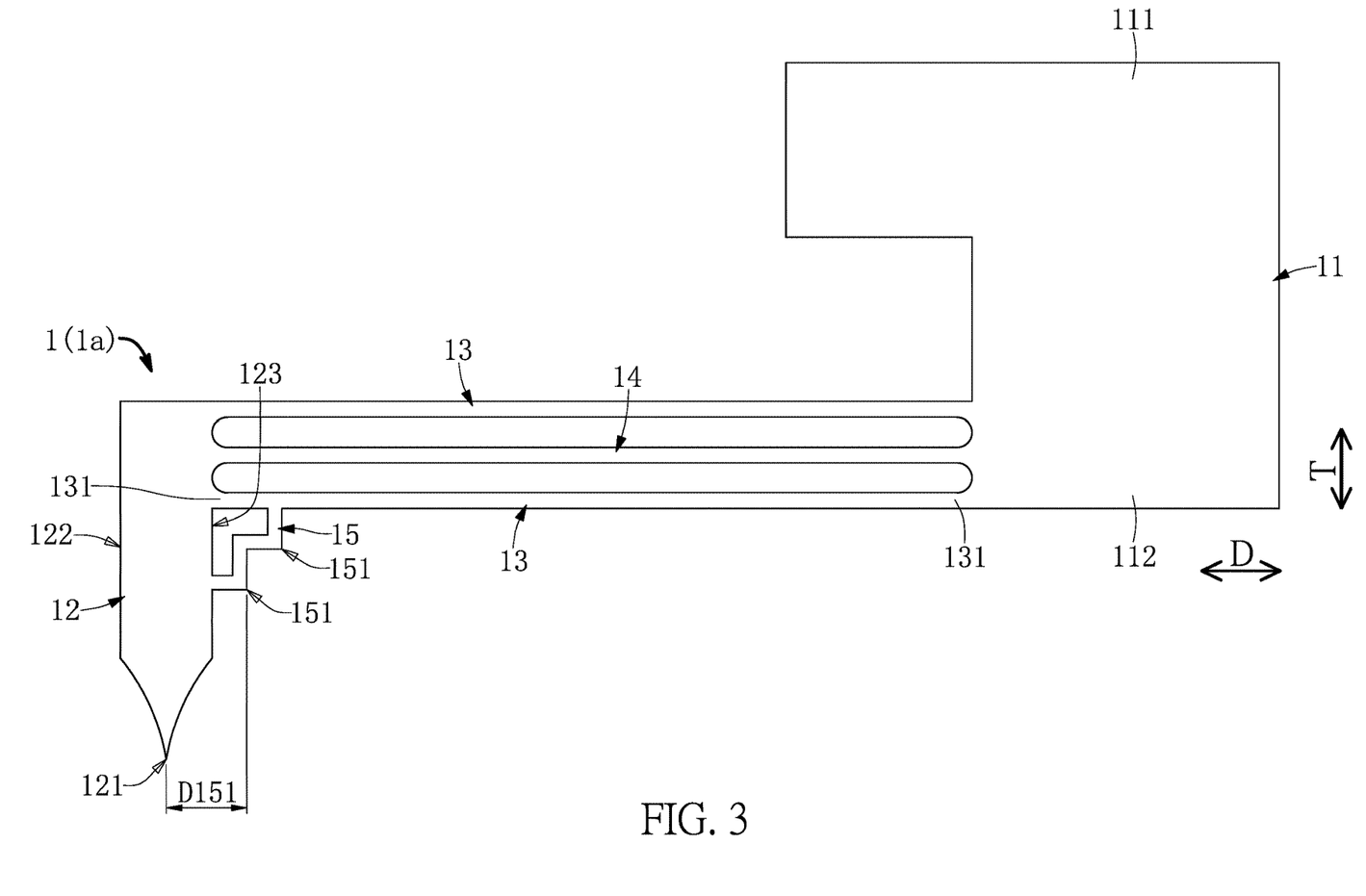
FIG. 3 is a planar view showing the cantilever probe in another configuration according to the first embodiment of the present disclosure.
Figure 4:
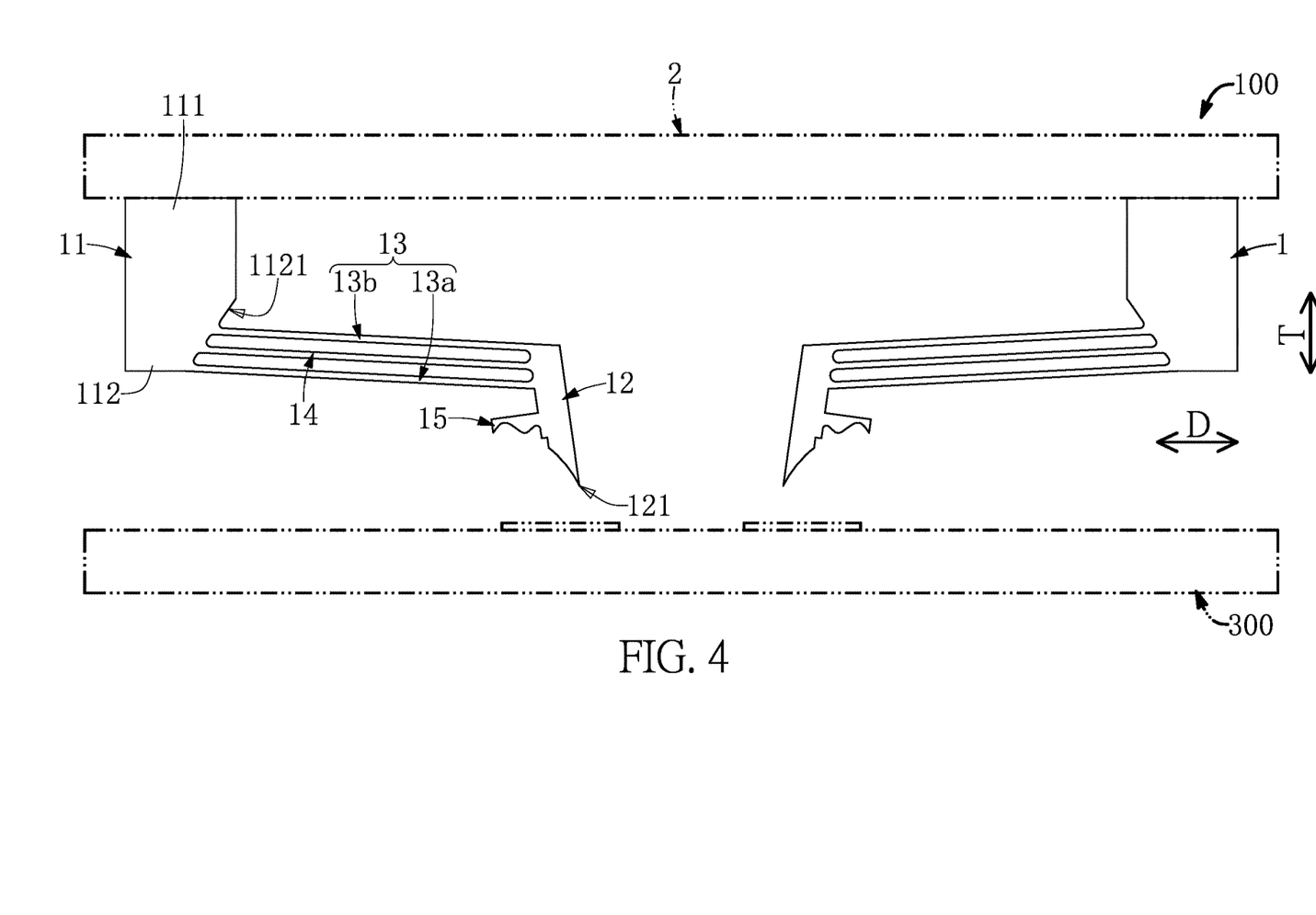
FIG. 4 is a planar view of the cantilever probe card device according to a second embodiment of the present disclosure.

Referring to FIG. 1 to FIG. 3, a first embodiment of the present disclosure provides a cantilever probe card device 100. The cantilever probe card device 100 includes a substrate 2 and a plurality of cantilever probes 1 that are fixed onto the substrate 2. In other words, any probe without having a cantilever configuration is different from the cantilever probe 1 described in the present embodiment.

It should be noted that the cantilever probe 1 in the present embodiment can be referred to as a focusing probe 1a. Moreover, as the focusing probes 1a in the present embodiment are of substantially the same structure, the following description discloses the structure of just one of the focusing probes 1a for the sake of brevity, but the present disclosure is not limited thereto. For example, in other embodiments of the present disclosure not shown in the drawings, the focusing probes 1a can be of different structures.

Furthermore, the cantilever probe card device 100 in the present embodiment is described according to the focusing probes 1a fixed onto the substrate 2, but the present disclosure is not limited thereto. For example, in other embodiments of the present disclosure not shown in the drawings, the focusing probe 1a can be independently used (e.g., sold) or can be used in cooperation with other components.

As shown in FIG. 2, the focusing probe 1a is integrally formed as a single one-piece structure, and any portion of the focusing probe 1a has a cross section that has a substantially rectangular shape. The focusing probe 1a in the present embodiment includes a soldering segment 11, a testing segment 12, two outer elastic arms 13 connecting the soldering segment 11 and the testing segment 12, at least one inner elastic arm 14 arranged between the two outer elastic arms 13, and a focusing portion 15 that is connected to the testing segment 12, but the present disclosure is not limited thereto. For example, in other embodiments of the present disclosure not shown in the drawings, the at least one inner elastic arm 14 of the focusing probe 1a can be omitted.

Specifically, the soldering segment 11 has a first end 111 and a second end 112 that is opposite to the first end 111, and the focusing probe 1a is soldered onto the substrate 2 through the first end 111 of the soldering segment 11. In the present embodiment, a soldering manner applied to the first end 111 and the substrate 2 can be adjusted or changed according to design requirements; for example, the soldering manner can be implemented by a surface mount technology (SMT), a pin-in-paste (PIP) technology, or other soldering manners, but the present disclosure is not limited thereto.

The testing segment 12 is spaced apart from the soldering segment 11 along an arrangement direction D, and the arrangement direction D in the present embodiment is substantially parallel to a board surface of the substrate 2. The testing segment 12 has a needle tip 121, an outer edge 122, and an inner edge 123 that is opposite to the outer edge 122. The outer edge 122 and the inner edge 123 are respectively arranged at two opposite sides of the needle tip 121, and a width of the needle tip 121 along the arrangement direction D is less than or equal to 5 μm. Moreover, as shown in FIG. 2, the needle tip 121 can be arranged to be in closer proximity to the outer edge 122 than the inner edge 123; or, as shown in FIG. 3, the needle tip 121 can be arranged at a substantially center position between the inner edge 123 and the outer edge 122. In other words, the needle tip 121 in the present embodiment is not suitable to be arranged adjacent to the inner edge 123.

As shown in FIG. 2, each of the two outer elastic arms 13 has two end portions 131 respectively connected to the second end 112 of the soldering segment 11 and the inner edge 123 of the testing segment 12, and the two outer elastic arms 13 are spaced apart from each other along a testing direction T perpendicular to the arrangement direction D. Specifically, each of the two outer elastic arms 13 in the present embodiment has a straight shape and is substantially and perpendicularly connected to the testing segment 12 and the soldering segment 11, and a length of each of the two outer elastic arms 13 along the arrangement direction D is at least 150% of a length of the testing segment 12 along the arrangement direction D, but the present disclosure is not limited thereto.

A quantity of the at least one inner elastic arm 14 in the present embodiment is only one, but in other embodiments of the present disclosure not shown in the drawings, the quantity of the at least one inner elastic arm 14 can be more than one. Two ends of the at least one inner elastic arm 14 are respectively connected to the second end 112 of the soldering segment 11 and the inner edge 123 of the testing segment 12, and the at least one inner elastic arm 14 is spaced apart from the two outer elastic arms 13 along the testing direction T. Moreover, the at least one inner elastic arm 14 in the present embodiment has a straight shape and is substantially and perpendicularly connected to the testing segment 12 and the soldering segment 11, and a length of the at least one inner elastic arm 14 along the arrangement direction D is at least 150% of the length of the testing segment 12 along the arrangement direction D, but the present disclosure is not limited thereto.

The focusing portion 15 is connected to the inner edge 123 of the testing segment 12 and is located between the needle tip 121 and the two outer elastic arms 13, but the present disclosure is not limited thereto. In other words, the focusing portion 15 is substantially located in a space (or a corner) surroundingly defined by the inner edge 123 of the testing segment 12 and one of the two outer elastic arms 13 adjacent to the needle tip 121.

In the present embodiment, one end of the focusing portion 15 is connected to the inner edge 123 of the testing segment 12, and another end of the focusing portion 15 is a free end, but the present disclosure is not limited thereto. For example, as shown in FIG. 3, an end of the focusing portion 15 (e.g., a right end of the focusing portion 15 shown in FIG. 3) arranged away from the inner edge 123 is connected to one of the two outer elastic arms 13 adjacent thereto so as to jointly define an enclosed space, thereby effectively reducing any noise that the focusing portion 15 may possibly generate.

Specifically, as shown in FIG. 2, the focusing portion 15 has a plurality of focusing points 151 arranged on one side thereof (e.g., a lower side of the focusing portion 15 shown in FIG. 2) away from the two outer elastic arms 13. The needle tip 121 is preferably spaced apart from one of the focusing points 151 adjacent thereto along the arrangement direction D by a predetermined distance D151 that is within a range from 100 μm to 400 μm. Any two of the focusing points 151 adjacent to each other have a distance therebetween that is different from the predetermined distance D151.

In summary, the needle tip 121 and the focusing points 151 are configured to respectively form observation points in an observation process of a detecting apparatus 200 (e.g., a camera) for obtaining a position of the needle tip 121. In other words, the position of the needle tip 121 can be calculated and obtained according to the observation points generated from the focusing points 151. Accordingly, the focusing probe 1a of the cantilever probe card device 100 provided by the present embodiment can be formed with the focusing portion 15 for being used to effectively reduce the probability of the detecting device 200 misjudging the position of the needle tip 121.

Specifically, the focusing points 151 of the focusing portion 15 can have different shapes (as shown in FIG. 2 and FIG. 3) for forming the observation points having different sizes in the observation process of the detecting apparatus 200, thereby rapidly and accurately determining the position of the needle tip 121. It should be noted that the shape of the focusing portion 15 can be adjusted or changed according to design requirements and is not limited by FIG. 2 and FIG. 3 of the present embodiment.

In addition, as shown in FIG. 2, when the needle tip 121 is arranged in closer proximity to the outer edge 122 than the inner edge 123, the inner edge 123 of the testing segment 12 preferably has a notch 124 arranged on a position between the needle tip 121 and an adjacent one of the focusing points 151, thereby dispersing stress on the testing segment 12 for reducing a breaking probability of the testing segment 12.

Second Embodiment

Referring to FIG. 4 to FIG. 9, a second embodiment of the present disclosure is provided, which is similar to the first embodiment of the present disclosure. For the sake of brevity, descriptions of the same features in the first and second embodiments of the present disclosure (e.g., the connection relationship between the substrate 2 and the soldering segment 11 of the cantilever probe 1, and the connection relationship among portions of the cantilever probe 1) will be omitted herein, and the following description only discloses different features between the first and second embodiments (e.g., the structure of the cantilever probe 1).

Figure 5:
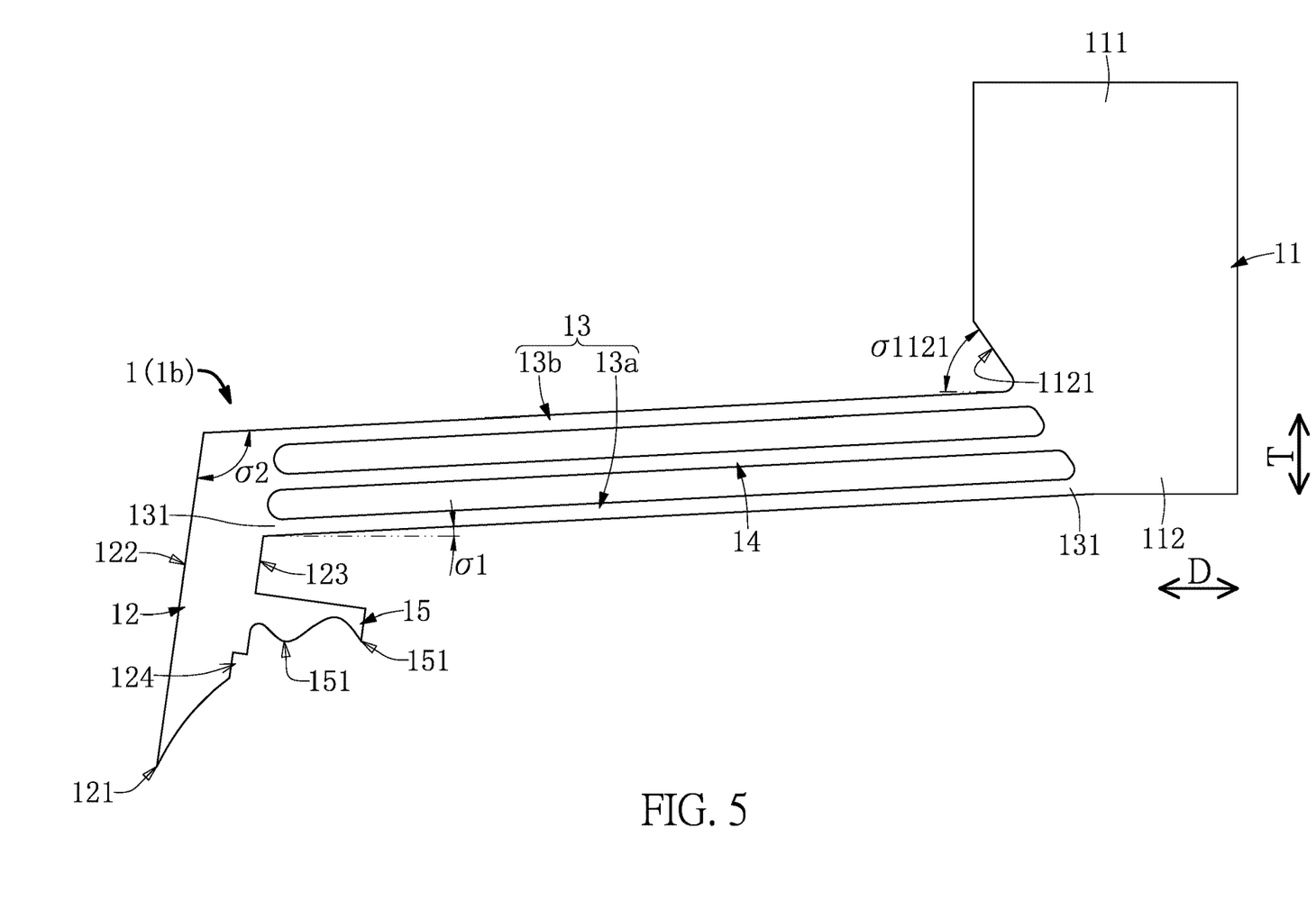
FIG. 5 is a planar view showing the cantilever probe of FIG. 4.
Figure 6:
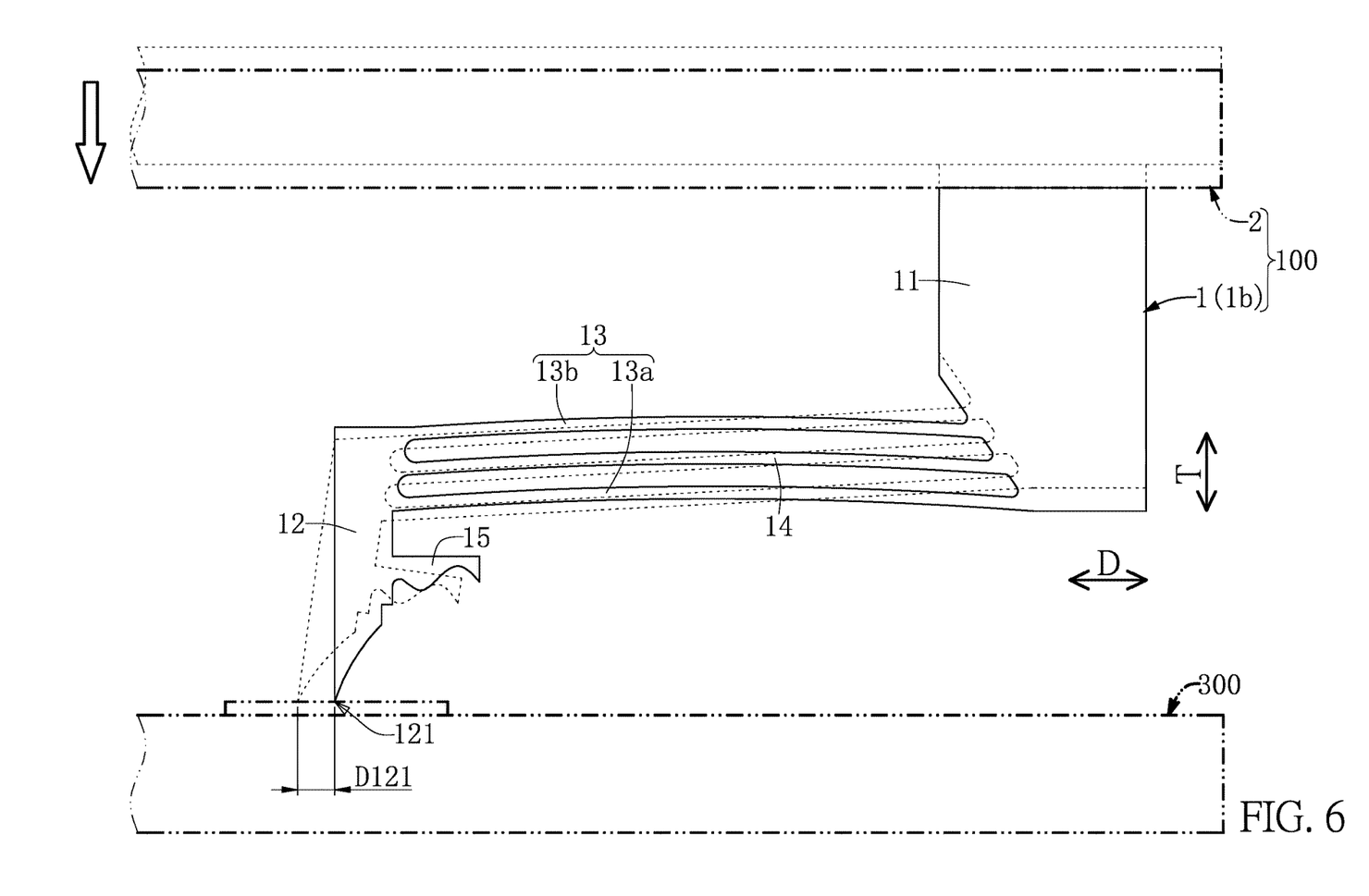
FIG. 6 is a planar view showing the cantilever probe card device having the cantilever probe of FIG. 5 that is abutted against a device under test (DUT)

As shown in FIG. 5 and FIG. 6, the cantilever probe 1 in the present embodiment can be referred to as an elastic probe 1b. Moreover, as the elastic probes 1b in the present embodiment are of substantially the same structure, the following description discloses the structure of just one of the elastic probes 1b for the sake of brevity, but the present disclosure is not limited thereto. For example, in other embodiments of the present disclosure not shown in the drawings, the elastic probes 1b can be of different structures.

Furthermore, the cantilever probe card device 100 in the present embodiment is described according to the elastic probes 1b fixed onto the substrate 2, but the present disclosure is not limited thereto. For example, in other embodiments of the present disclosure not shown in the drawings, the elastic probe 1b can be independently used (e.g., sold) or can be used in cooperation with other components.

Specifically, one of the two outer elastic arms 13 adjacent to the needle tip 121 is defined as a first outer elastic arm 13a, another one of the two outer elastic arms 13 is defined as a second outer elastic arm 13b, and a length of the first outer elastic arm 13a is greater than a length of the second outer elastic arm 13b. In the present embodiment, a difference between the length of the first outer elastic arm 13a and the length of the second outer elastic arm 13b is preferably within a range from 10 μm to 200 μm, but the present disclosure is not limited thereto.

The second end 112 of the soldering segment 12 has a layout edge 1121 that is non-parallel to the arrangement direction D (or non-parallel to the substrate 2), and the inner edge 123 and the layout edge 1121 are spaced apart from each other along the arrangement direction D by different distances therebetween. The layout edge 1121 in the present embodiment is tilted, and the layout edge 1121 and the arrangement direction D (i.e., the direction parallel to the board surface of the substrate 2) have a layout angle σ1121 therebetween that is within a range from 10 degrees to 85 degrees, but the present disclosure is not limited thereto.

Moreover, any one of the two outer elastic arms 13 is non-parallel to the arrangement direction D (or non-parallel to the substrate 2), and the needle tip 121 of the testing segment 12 is non-perpendicular to the arrangement direction D (or non-perpendicular to the substrate 2). In the present embodiment, a first angle σ1 between the arrangement direction D and any one of the two outer elastic arms 13 is within a range from 0 degrees to 75 degrees, and a second angle σ2 between the testing segment 12 and any one of the two outer elastic arms 13 is within a range from 45 degrees to 150 degrees, but the present disclosure is not limited thereto.

Accordingly, when the needle tip 121 of each of the elastic probes 1b abuts against a device under test (DUT) 300, at least one of the two outer elastic arms 13 is elastically deformable, thereby effectively absorbing a reaction force and allowing a displacement D121 of the needle tip 121 along the arrangement direction D to be less than 20 μm.

Specifically, when the needle tip 121 abuts against the DUT 300, the elastic probe 1b can be further moved toward the DUT 300 along the testing direction T by a distance that is preferably within a range from 80 μm to 200 μm. Moreover, during the above movement of the elastic probe 1b toward the DUT 300, the testing segment 12 is rotatable toward a position where the needle tip 121 is perpendicular to the arrangement direction D, thereby effectively absorbing (or reducing) deformation of the two outer elastic arms 13 and decreasing the displacement D121 of the needle tip 121.

Figure 7:
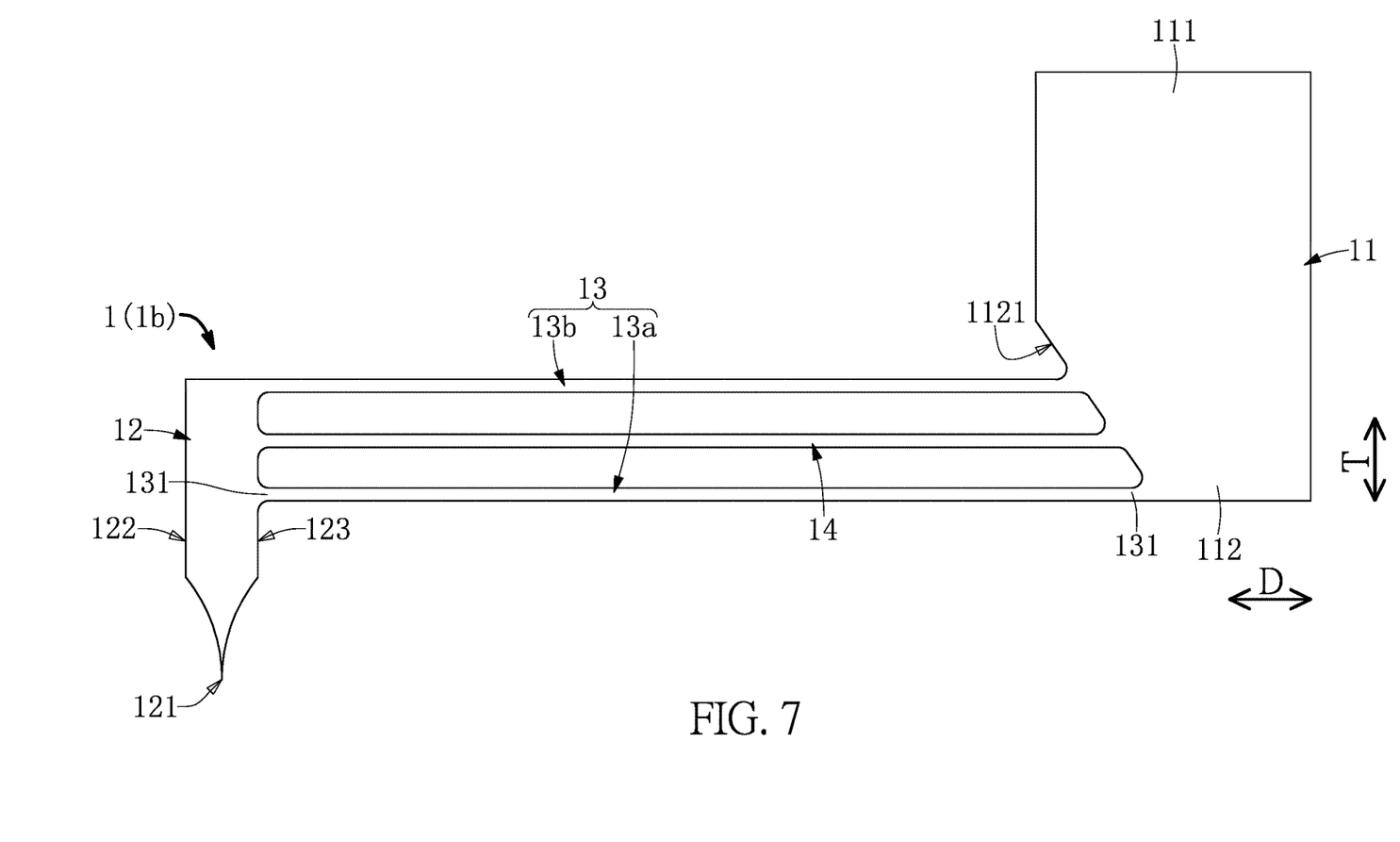
FIG. 7 is a planar view showing the cantilever probe in another configuration according to the second embodiment of the present disclosure.
Figure 8:
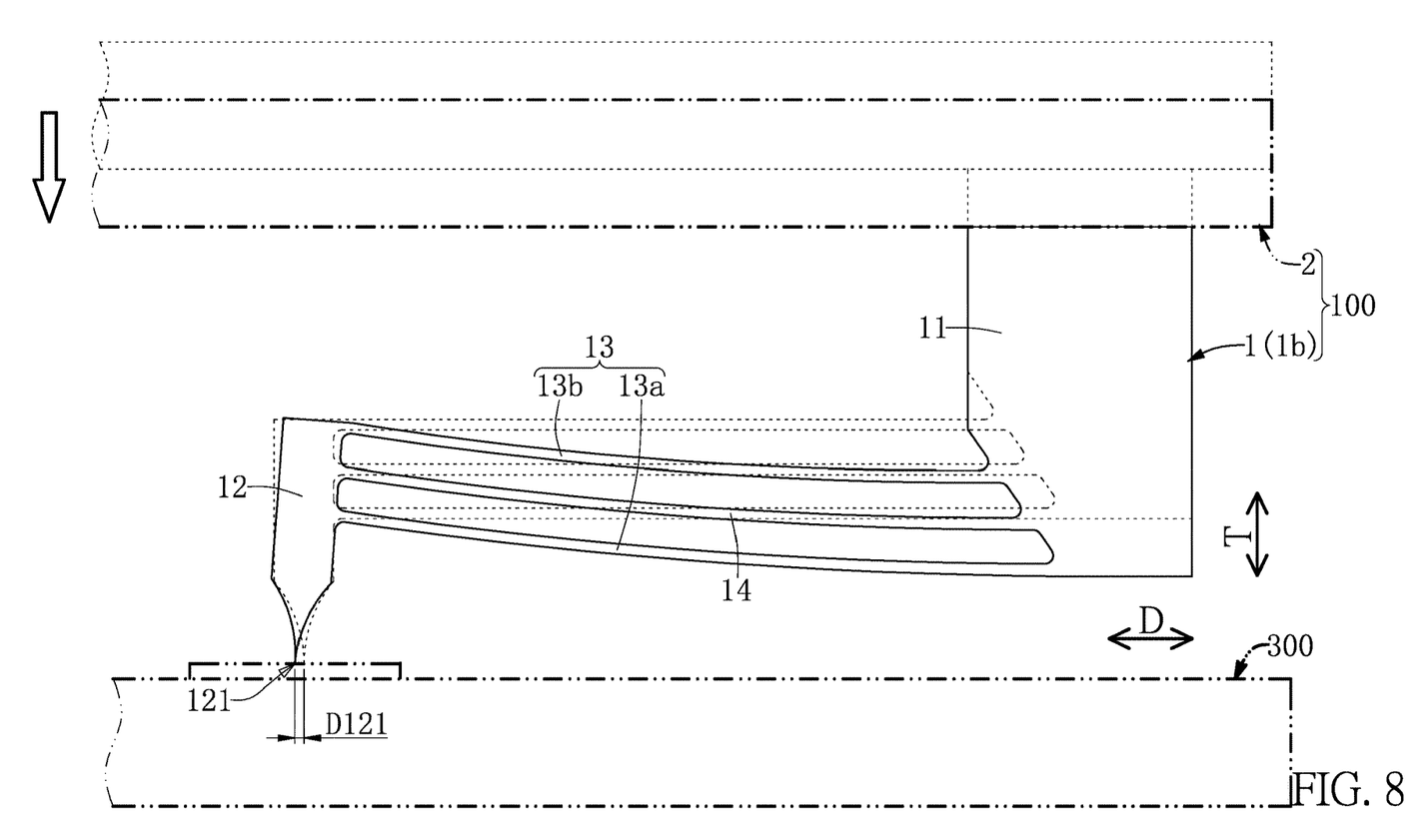
FIG. 8 is a planar view showing the cantilever probe card device having the cantilever probe of FIG. 7 that is abutted against the DUT.
Figure 9:
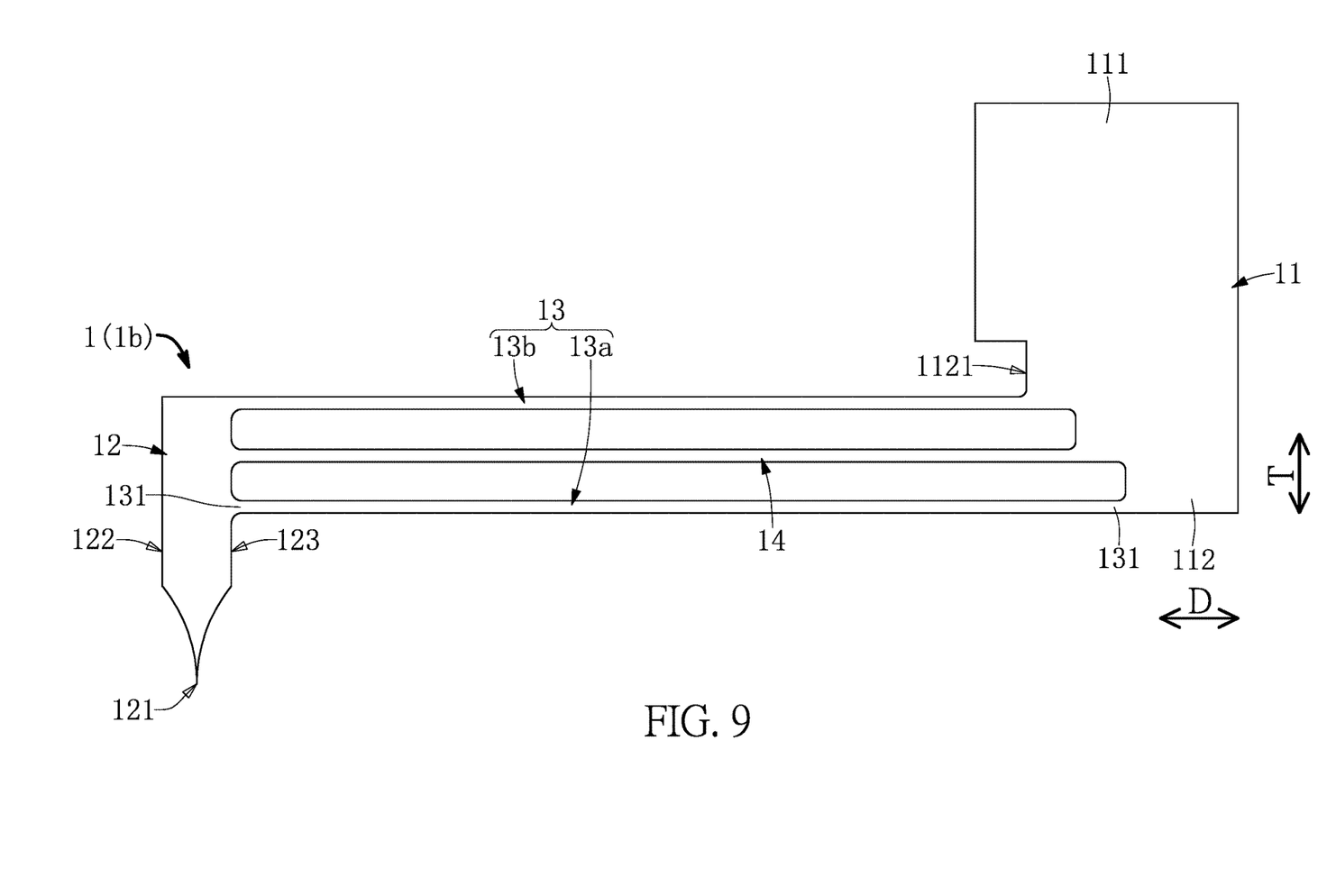
FIG. 9 is a planar view showing the cantilever probe in still another configuration according to the second embodiment of the present disclosure.

In addition, the elastic probe 1b of the present embodiment is provided as shown in FIG. 5 and FIG. 6 for reducing the displacement D121 as much as possible, but the present disclosure is not limited thereto. In other words, the structure of the elastic probe 1b can be adjusted or changed according to design requirements. As shown in FIG. 7 and FIG. 8, the at least one inner elastic arm 14 and any one of the two outer elastic arms 13 can be parallel to the arrangement direction D (or the substrate 2), the needle tip 121 of the testing segment 12 can be perpendicular to the arrangement direction D (or the substrate 2), and the focusing portion 15 can be omitted. Moreover, as shown in FIG. 9, the layout edge 112 is not tilted and can be a stepped structure. In addition, the cantilever probe 1 of the present embodiment having the focusing portion 15a can also be referred to as the focusing probe.

Third Embodiment

Referring to FIG. 10 to FIG. 13, a third embodiment of the present disclosure is provided, which is similar to the first and second embodiments of the present disclosure. For the sake of brevity, descriptions of the same features in the first to third embodiments of the present disclosure will be omitted herein, and the following description only discloses different features among the first to third embodiments.

Figure 10:
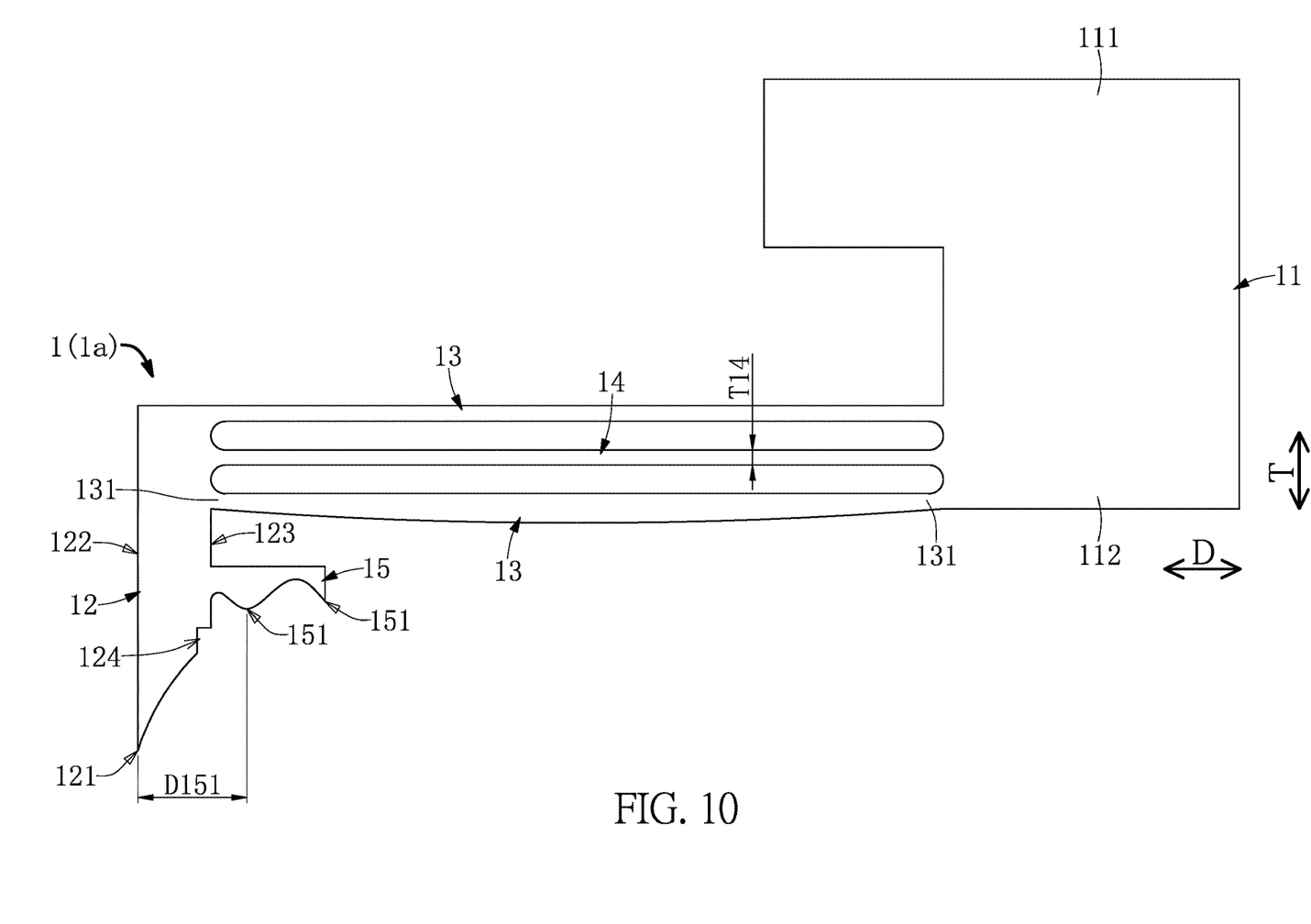
FIG. 10 is a planar view of a focusing probe having a thickened outer elastic arm according to a third embodiment of the present disclosure.
Figure 11:
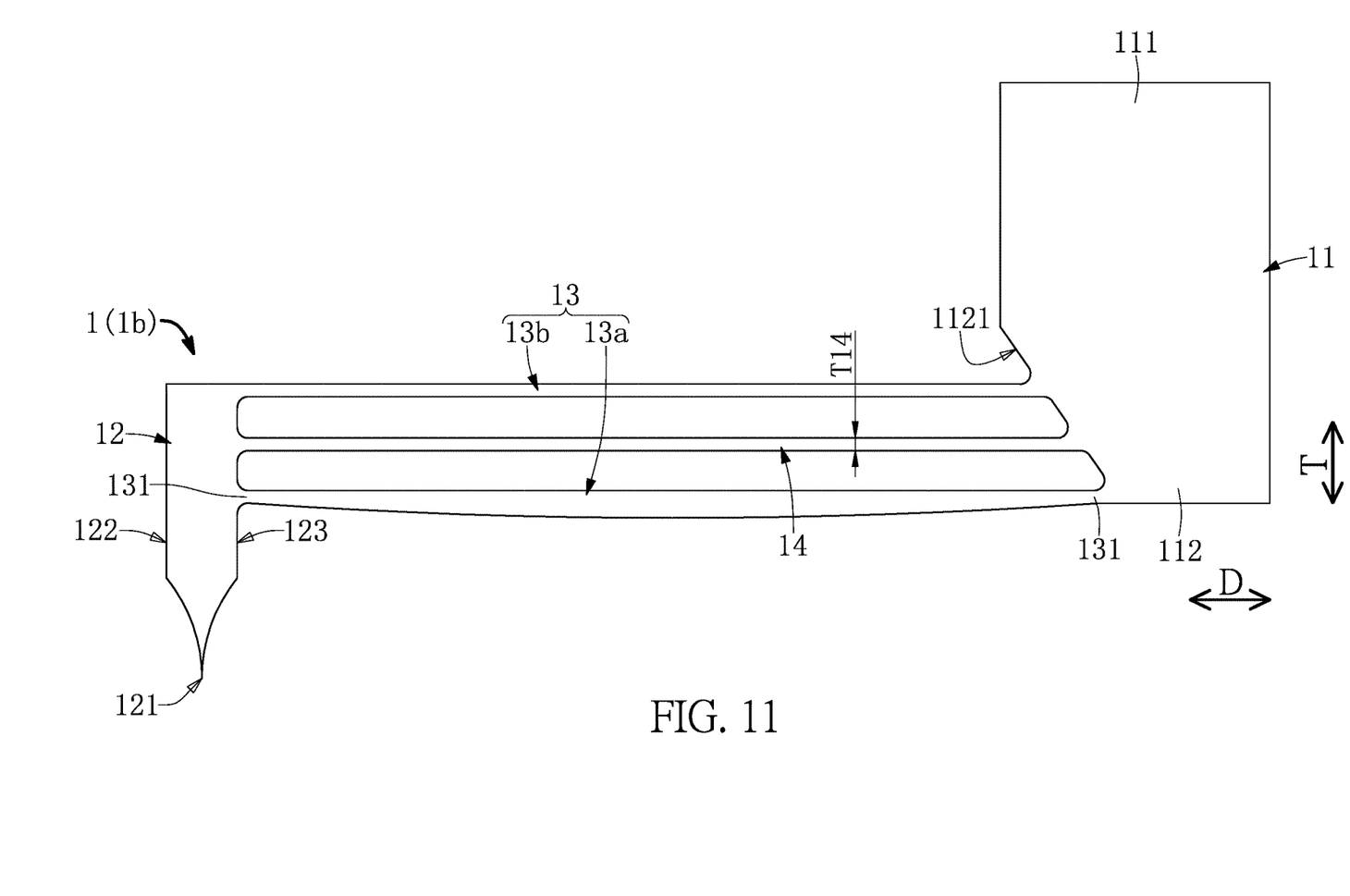
FIG. 11 is a planar view of an elastic probe having a thickened outer elastic arm according to the third embodiment of the present disclosure.

As shown in FIG. 10 and FIG. 11 of the present embodiment, a thickness of at least one of the two outer elastic arms 13 (e.g., the first outer elastic arm 13a) gradually increases from the two end portions 131 along a direction toward each other, and the at least one inner elastic arm 14 has a predetermined thickness T14 equal to a thickness of any one of the two end portions 131 of each of the two outer elastic arms 13.

Figure 12:
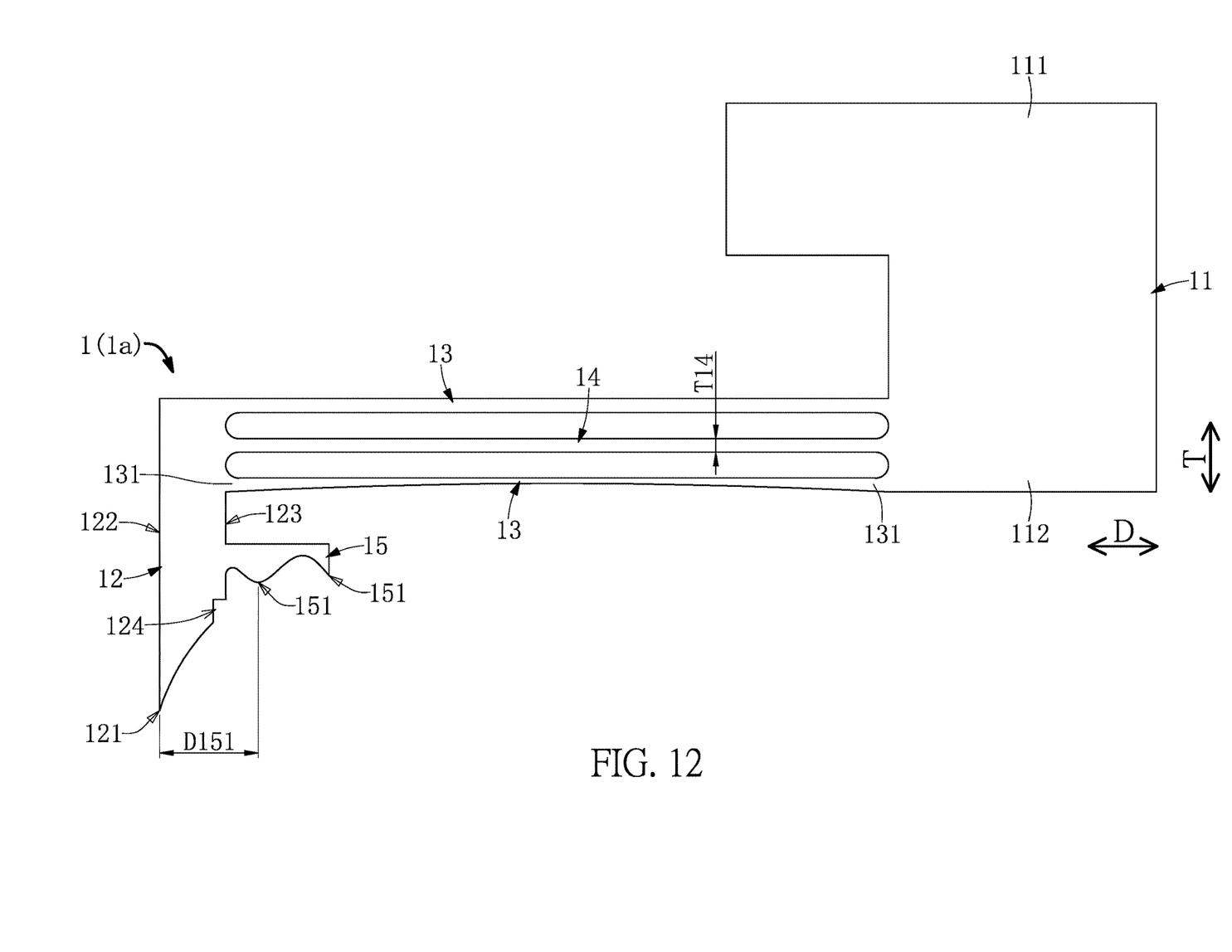
FIG. 12 is a planar view of the focusing probe having a thinned outer elastic arm according to a third embodiment of the present disclosure.
Figure 13:
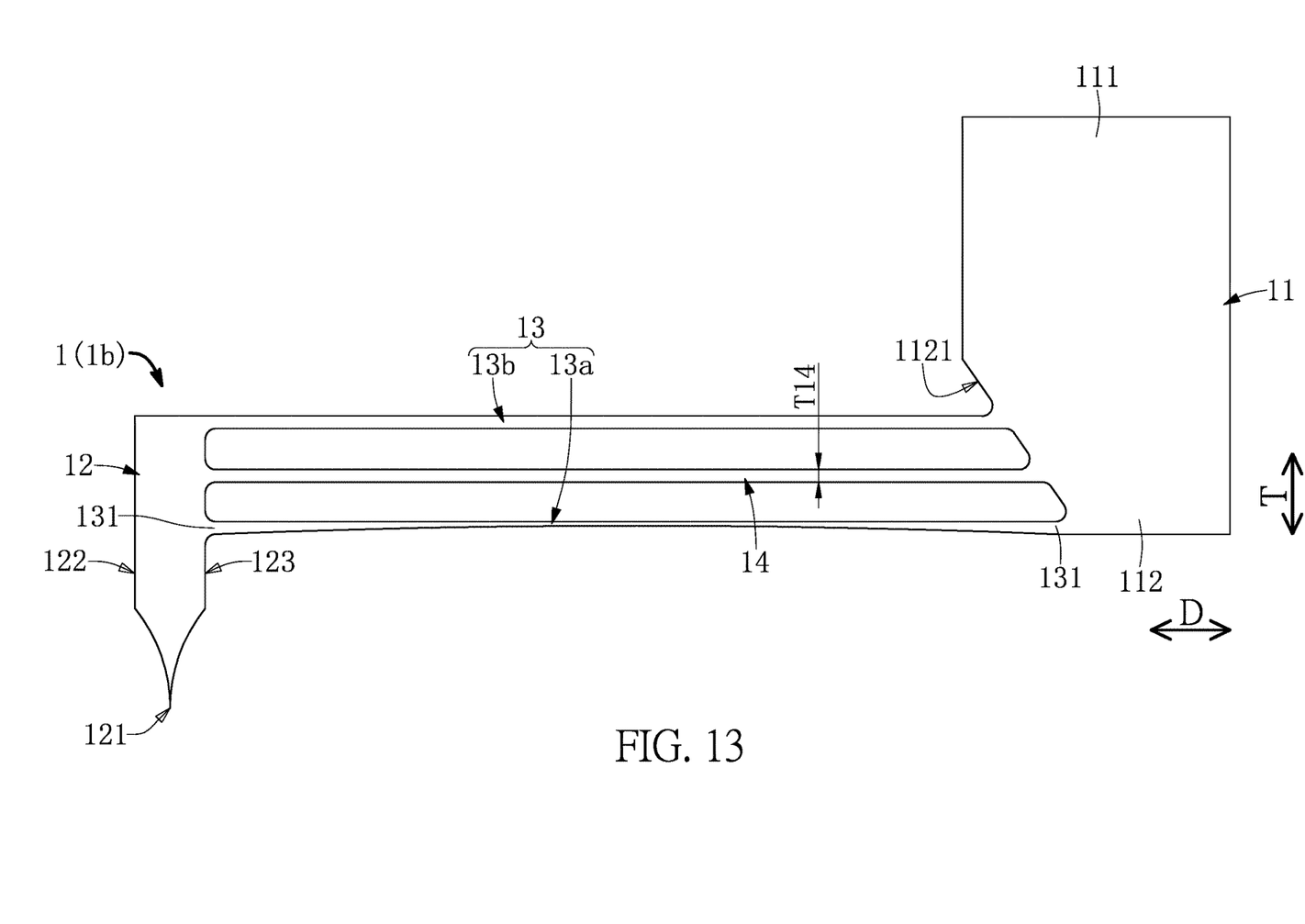
FIG. 13 is a planar view of the elastic probe having a thinned outer elastic arm according to the third embodiment of the present disclosure.

As shown in FIG. 12 and FIG. 13 of the present embodiment, a thickness of at least one of the two outer elastic arms 13 (e.g., the first outer elastic arm 13a) gradually decreases from the two end portions 131 along a direction toward each other, and the at least one inner elastic arm 14 has a predetermined thickness T14 equal to a thickness of any one of the two end portions 131 of each of the two outer elastic arms 13.

In other words, when the thickness of the at least one of the two outer elastic arms 13 gradually increases or decreases, the thickness of the at least one inner elastic arm 14 and the thickness of any one of the two end portions 131 can remain as unchanged as possible (e.g., remain at the predetermined thickness T14), thereby preventing the thickness variation of the at least one of the two outer elastic arms 13 from overly affecting an operation of the cantilever probe 1.

Accordingly, structural properties of the cantilever probe 1 (e.g., the focusing probe 1a or the elastic probe 1b) of the cantilever probe card device 100 can be adjusted through the thickness variation of at least one of the two outer elastic arms 13 so as to meet different testing requirements.

Beneficial Effects of the Embodiments

In conclusion, the focusing probe of the cantilever probe card device provided by the present disclosure can be formed with the focusing portion having the specific structure (e.g., the focusing portion being connected to the inner edge and being located between the needle tip and the two outer elastic arms, and the focusing points being arranged on one side of the focusing portion away from the two outer elastic arms) for being used to effectively reduce the probability that the position of the needle tip is misjudged by the detecting device.

Moreover, the elastic probe of the cantilever probe card device provided by the present disclosure can be formed with the specific structure (e.g., the length of the first outer elastic arm is greater than that of the second outer elastic arm), such that when the needle tip abuts against the DUT, at least one of the two outer elastic arms is elastically deformable, thereby effectively absorbing a reaction force and allowing the displacement of the needle tip along the arrangement direction to be less than 20 μm.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A cantilever probe card device, comprising:
   a substrate; and
   a plurality of elastic probes fixed to the substrate, wherein each of the elastic probes includes:
      a soldering segment having a first end and a second end that is opposite to the first end, wherein the first end is soldered onto the substrate;
      a testing segment spaced apart from the soldering segment along an arrangement direction, wherein the testing segment has a needle tip, an outer edge, and an inner edge that is opposite to the outer edge; and
      two outer elastic arms spaced apart from each other, wherein each of the two outer elastic arms has two end portions respectively connected to the second end of the soldering segment and the inner edge of the testing segment, wherein one of the two outer elastic arms adjacent to the needle tip is defined as a first outer elastic arm, and another one of the two outer elastic arms is defined as a second outer elastic arm, and wherein a length of the first outer elastic arm is greater than a length of the second outer elastic arm;

wherein, when the needle tip of each of the elastic probes abuts against a device under test (DUT), at least one of the two outer elastic arms is elastically deformable so as to allow a displacement of the needle tip along the arrangement direction to be less than 20 µm.

2. The cantilever probe card device according to claim 1, wherein, in each of the elastic probes, a difference between the length of the first outer elastic arm and the length of the second outer elastic arm is within a range from 10 µm to 200 µm.

3. The cantilever probe card device according to claim 1, wherein, in each of the elastic probes, the second end of the soldering segment has a layout edge that is non-parallel to the arrangement direction, and the inner edge and the layout edge are spaced apart from each other along the arrangement direction by different distances therebetween.

4. The cantilever probe card device according to claim 3, wherein, in each of the elastic probes, the layout edge is tilted, and the layout edge and the arrangement direction have a layout angle therebetween that is within a range from 10 degrees to 85 degrees.

5. The cantilever probe card device according to claim 1, wherein the arrangement direction is parallel to a board surface of the substrate, wherein, in each of the elastic probes, any one of the two outer elastic arms is non-parallel to the arrangement direction, and the needle tip of the testing segment is non-perpendicular to the arrangement direction, and wherein, when the needle tip of each of the elastic probes abuts against the DUT, the testing segment is rotatable toward a position where the needle tip is perpendicular to the arrangement direction.

6. The cantilever probe card device according to claim 5, wherein, in each of the elastic probes, a first angle between the arrangement direction and any one of the two outer elastic arms is within a range from 0 degrees to 75 degrees, and a second angle between the testing segment and any one of the two outer elastic arms is within a range from 45 degrees to 150 degrees.

7. The cantilever probe card device according to claim 1, wherein each of the elastic probes further includes at least one inner elastic arm arranged between the two outer elastic arms, and two ends of the at least one inner elastic arm are respectively connected to the second end of the soldering segment and the inner edge of the testing segment.

8. The cantilever probe card device according to claim 7, wherein, in each of the focusing probes, at least one of the two outer elastic arms has a thickness that gradually increases from the two end portions along a direction toward each other, and the at least one inner elastic arm has a predetermined thickness equal to a thickness of any one of the two end portions of each of the two outer elastic arms.

9. The cantilever probe card device according to claim 7, wherein, in each of the elastic probes, at least one of the two outer elastic arms has a thickness that gradually decreases from the two end portions along a direction toward each other, and the at least one inner elastic arm has a predetermined thickness equal to a thickness of any one of the two end portions of each of the two outer elastic arms.

10. An elastic probe of a cantilever probe card device, comprising:
   a soldering segment having a first end and a second end that is opposite to the first end, wherein the first end is configured to be soldered onto a substrate;
   a testing segment spaced apart from the soldering segment along an arrangement direction, wherein the testing segment has a needle tip, an outer edge, and an inner edge that is opposite to the outer edge; and
   two outer elastic arms spaced apart from each other, wherein each of the two outer elastic arms has two end portions respectively connected to the second end of the soldering segment and the inner edge of the testing segment, wherein one of the two outer elastic arms adjacent to the needle tip is defined as a first outer elastic arm, and another one of the two outer elastic arms is defined as a second outer elastic arm, and wherein a length of the first outer elastic arm is greater than a length of the second outer elastic arm.

* * * * *